United States Patent [19]

Saitou et al.

[11] Patent Number: 4,692,579
[45] Date of Patent: Sep. 8, 1987

[54] ELECTRON BEAM LITHOGRAPHY APPARATUS

[75] Inventors: Norio Saitou, Iruma; Susumu Ozasa, Kashiwa; Masahide Okumura, Sagamihara; Mitsuo Ooyama, Hachioji; Tsutomu Komoda, Nishitama; Katsuhiro Harada; Minpei Fujinami, both of Tokyo; Kazumi Iwadate, Higashimurayama, all of Japan

[73] Assignees: Hitachi, Ltd.; Nippon Telegraph & Telephone Corporation, both of Tokyo, Japan

[21] Appl. No.: 735,184

[22] Filed: May 17, 1985

[30] Foreign Application Priority Data

May 18, 1984 [JP] Japan .................................. 59-98675
May 18, 1984 [JP] Japan .................................. 59-98676
May 18, 1984 [JP] Japan .................................. 59-98677

[51] Int. Cl.⁴ ........................................... H01J 37/00
[52] U.S. Cl. ................................. 250/492.2; 250/398
[58] Field of Search .......................... 250/492.2, 398

[56] References Cited

U.S. PATENT DOCUMENTS

| 4,199,689 | 4/1980 | Takigawa | 250/492.2 |
| 4,494,004 | 1/1985 | Mauer et al. | 250/492.2 |
| 4,511,980 | 4/1985 | Watanabe | 250/492.2 |
| 4,586,141 | 4/1986 | Yasuda et al. | 250/492.2 |

FOREIGN PATENT DOCUMENTS

| 120277 | 10/1978 | Japan | 250/492.2 |
| 36131 | 4/1981 | Japan | 250/492.2 |

Primary Examiner—Bruce C. Anderson
Attorney, Agent, or Firm—Antonelli, Terry & Wands

[57] ABSTRACT

An electron beam lithography apparatus comprises: a spot electron beam generator; device for exposing a desired pattern onto a wafer using the spot beam; device for dividing the pattern into small regions; and device for designating an origin of the small region and also digitally scanning the portion inside the small region by a fixed correction amount by use of the spot beam, and thereby to reduce the settling time of the D/A converter in association with the digital scanning.

7 Claims, 15 Drawing Figures

FIG. 8A  FIG. 8B
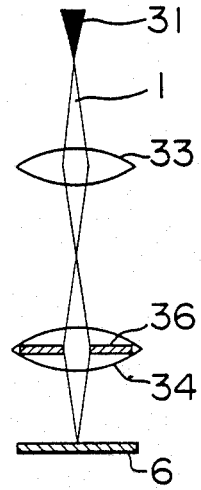 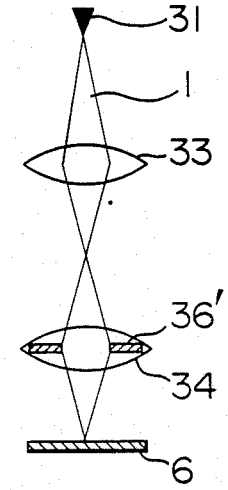
FIG. 9A  FIG. 9B
 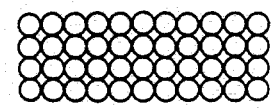

ELECTRON BEAM LITHOGRAPHY APPARATUS

BACKGROUND OF THE INVENTION

The present invention relates to an electron beam lithography apparatus in which a desired pattern is exposed on a wafer or mask plate by means of a digital scanning of a spot beam.

FIG. 1 shows an arrangement of a conventional digitally scanned electron beam lithography system using a double deflector. An electron beam 1 passes through a beam blanker 2, an aperture 3, a subdeflector 4, and a main deflector 5 and reaches a wafer 6. In the diagram, the region surrounded by a solid line indicates the main-field on the wafer 6 where the electron beam 1 is deflected by the main deflector 5, while the region surrounded by broken lines in the diagram represents the sub-field where the electron beam is deflected by the subdeflector 4. Namely, the deflection from a sub-field to the next sub-field is performed by means of the main deflector 5, while the deflection in a single sub-field is carried out by means of the subdeflector 4. A circuit to control the foregoing electron optical column is shown on the left side part of this diagram. Pattern data and calibration data of deflection distortion are respectively sent from a control computer 15 to a pattern buffer memory 7 and a correction circuit 8. One of the outputs of the circuit 8 serves to designate the center of the sub-field in the field by correcting the deflection error and makes a main deflection D/A converter 9 operative.

In a pattern-dividing circuit 10, a pattern is divided into small regions (dot fields). The portion inside the small region is divided into dots by a dot dividing circuit 11. A correction circuit 12 for sub-deflection corrects the deflection error for every dot by use of correction coefficients at every sub-field which are sent from the correction circuit 8. Outputs of the correction circuit 12 are inputted to a sub-deflection D/A converter 13 and a blanking amplifier 14.

FIG. 2 shows an example of the state in that a single pattern 23 is exposed in the foregoing system arrangement. An enlarged diagram of one sub-field 22 in a field 21 is shown on the right side part of FIG. 2. The trapezoid pattern 23 in one sub-field 22 in the field 21 is divided into seven small regions (dot fields) corresponding to the hatched portion in the diagram. One region 24 of the dot fields is digitally exposed by the spot beam 1 on a dot unit basis.

In this arrangement, the numbers of bits of the D/A converters 9 and 13 which respectively determine the field and sub-field are ordinarily set to values of about eighteen and twelve bits. Assuming that the minimum unit (Least Significant Bit i.e. LSB) of the digital scanning is 0.01 $\mu$m, those fields become 2.5 mm square field and 40 $\mu$m square sub-field. In this case, the dot exposure of the dot field 24 is performed by the sub-deflection D/A converter 13.

On the other hand, there is generally a contradictory relation between the settling time of the D/A converter (time until the output of the D/A converter reaches a value within an allowable range of the final value after data changed) and the resolution. The settling time becomes long as the resolution becomes high. For example, the settling time is about 100 nsec in the case of the 12-bit D/A converter, while it is about 10 nsec in the case of the 8-bit D/A converter. Further, in such a conventional arrangement, the deflection error correction is performed for every dot and the beam blanking operation is carried out. Therefore, it takes an additional processing time for correction and it is also difficult to adjust the ON-OFF timing of the beam.

On the other hand, a current density of the spot beam, 500 A/cm$^2$ can be easily obtained from the conventional technology. Assuming that a resist sensitivity is below 5 $\mu$c/cm$^2$, the exposed time per one dot may be below 10 nsec. Therefore, the exposure in such a conventional system is ordinarily determined by the settling time of the D/A converter rather than the resist exposed time. In other words, since it takes a time of about 100 nsec for the spot beam to be digitally moved to the adjacent point, the current density of the electron beam has to be reduced to perform the exposure even if high current density is obtained.

SUMMARY OF THE INVENTION

It is an object of the present invention to eliminate the foregoing drawback and to provide an electron beam lithography apparatus which can perform the high speed operation.

To accomplish the above object, according to one aspect of the present invention, an electron beam lithography apparatus comprises: means for generating a spot beam; means for exposing a desired pattern onto a wafer using the above-mentioned spot beam; means for dividing this pattern into small regions; and means for designating an origin of the small region and also digitally scanning the inside of the small region by means of the spot beam by a fixed correction.

Owing to such a characteristic arrangement of the invention, the settling time of the D/A converter in association with the digital scanning can be reduced, so that it is possible to provide a high speed and high accurate electron beam lithography apparatus which can make the most of the high current density of the electron beam.

BRIEF DESCRIPTION OF THE DRAWINGS

FIGS. 7A, 7B, 8A, and 8B are fundamental arrangement diagrams of means for switching an electron beam diameter and a current value according to the invention.

FIGS. 9A and 9B are diagrammatical views for explaining a dot exposing method in the case of changing the electron beam diameter and dot-pitch according to the invention.

DESCRIPTION OF THE PREFERRED EMBODIMENTS

The present invention will be described in detail hereinbelow with respect to an embodiment.

Figure 1:
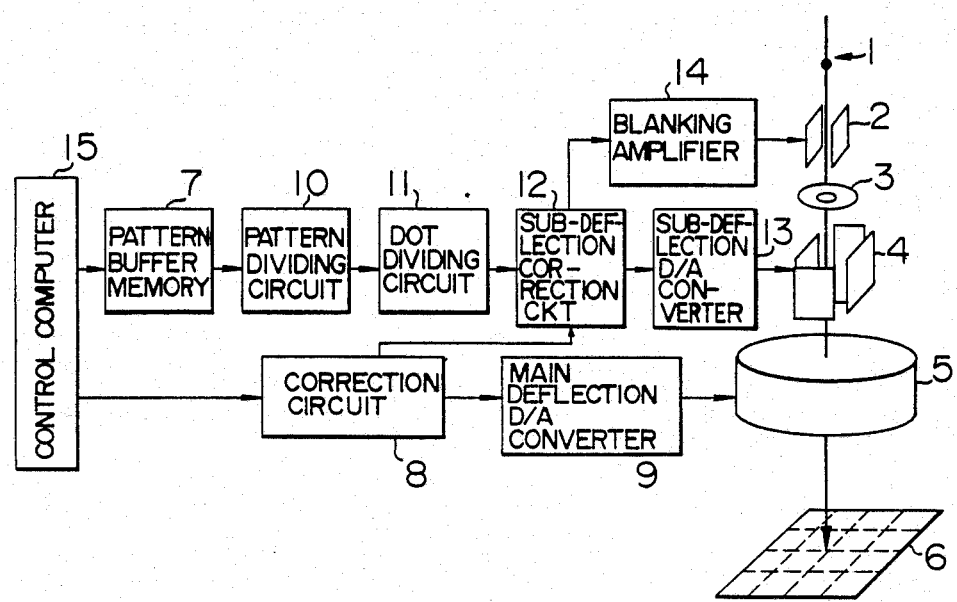
FIG. 1 is a fundamental arrangement diagram of a conventional electron beam lithography apparatus.
Figure 2:
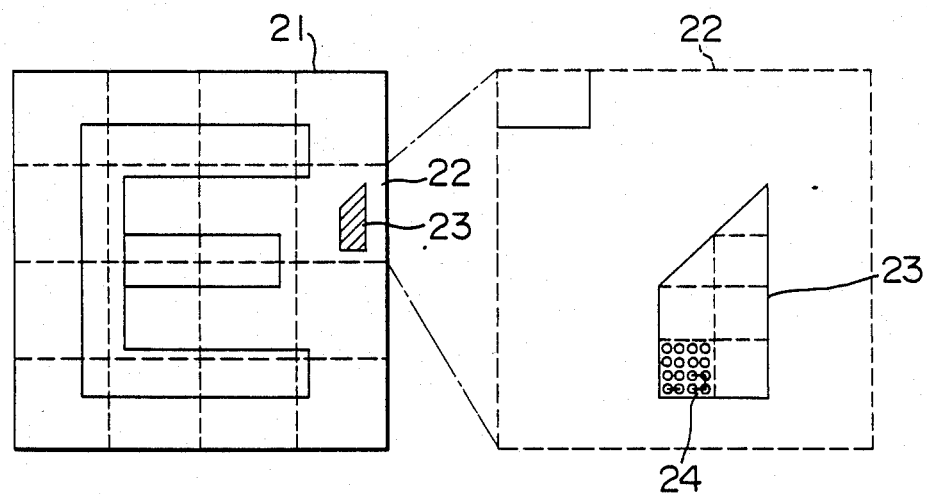
FIG. 2 is a diagrammatical view for explaining the division of the field, sub-field and dot field.
Figure 3:
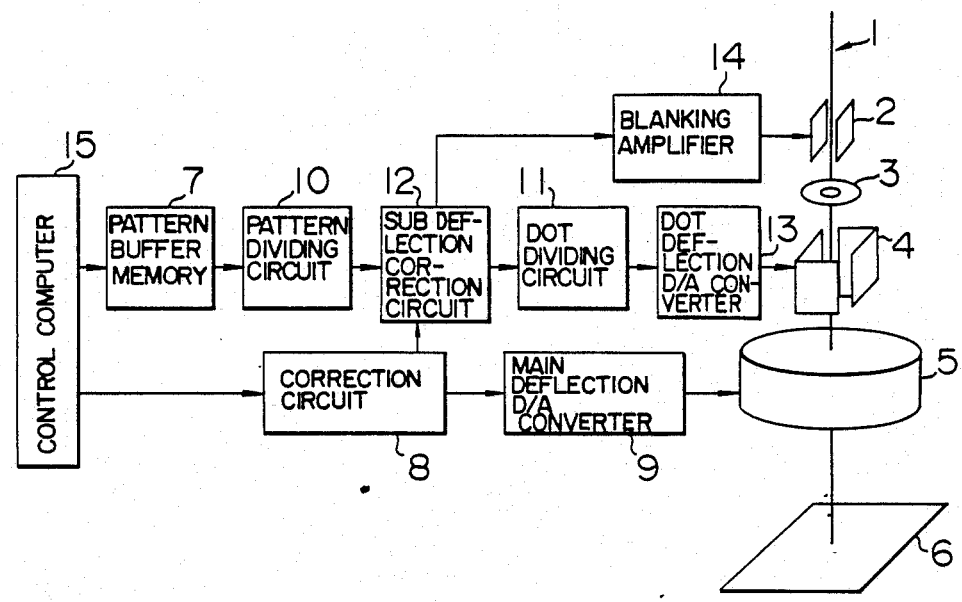
FIG. 3 is a fundamental arrangement diagram of an electron beam lithography apparatus according to the present invention.

FIG. 3 shows a system in which the order of the arrangements of the dot dividing circuit 11 and correction circuit 12 for sub-deflection in the conventional system in FIG. 1 is reversed. In FIG. 3, the functions of the parts and components indicated by reference numerals 1 to 15 are similar to those in FIG. 1. In this embodiment, the deflection error correction is applied to the correction circuit 8 for every small divided region (dot field) 24. The deflection error correction for every dot is not performed in the dot dividing circuit 11. Practically speaking, by setting a ratio of the number of bits between the main deflection D/A converter 9 and the sub-deflection D/A converter 13 to be sufficiently large, there becomes unnecessary to perform the deflection error correction for every dot in the dot field 24. For instance, when the ratio of the number of bits between the D/A converters 9 and 13 is set to about $2^{10}$ (to $10^3$) (for example, in the case where the 18-bit D/A converter is used as the main deflection D/A converter 9 and the 8-bit D/A converter is used as the sub-deflection D/A converter 13), the deflection error of the dot field 24 becomes about $10^{-3}$ of the deflection error (about a few $\mu$m) of the field 21; therefore, this error can be ignored without correction. That is, there is no need to perform the deflection error correction for every dot within a range of deflection by means of the D/A converter 13.

The ON-OFF operations of the electron beam 1 are performed only at the start and end points of the dot field 24 and are not carried out for every dot.

As described above, the settling time of the D/A converter can be set to below 10 nsec and thereby making it possible to avoid that the exposed time is determined due to the settling time of the D/A converter 13.

However, in the embodiment in FIG. 3, the number of dot fields 24 becomes too large (for example, for 18 bits of the main deflection D/A converter 9, this number becomes $(2^{18}/2^8)^2 \simeq 10^6$ in 8 bits of the sub-deflection D/A converter 13), so that this causes a problem in the case where the settling time of the D/A converter 9 is long. No problem will be caused in the case of using, e.g., an electrostatic deflector as main deflecting means. However, in the case of using an electromagnetic deflector, the settling time becomes about 10 $\mu$sec due to an eddy current or the like. In this case, the total settling time of the D/A converter 9 becomes $10^6 \times 10$ $\mu$sec = 10 seconds and this value is several tens of times larger than the stage movement time (ordinarily, below one second) for every field 21.

Figure 4:
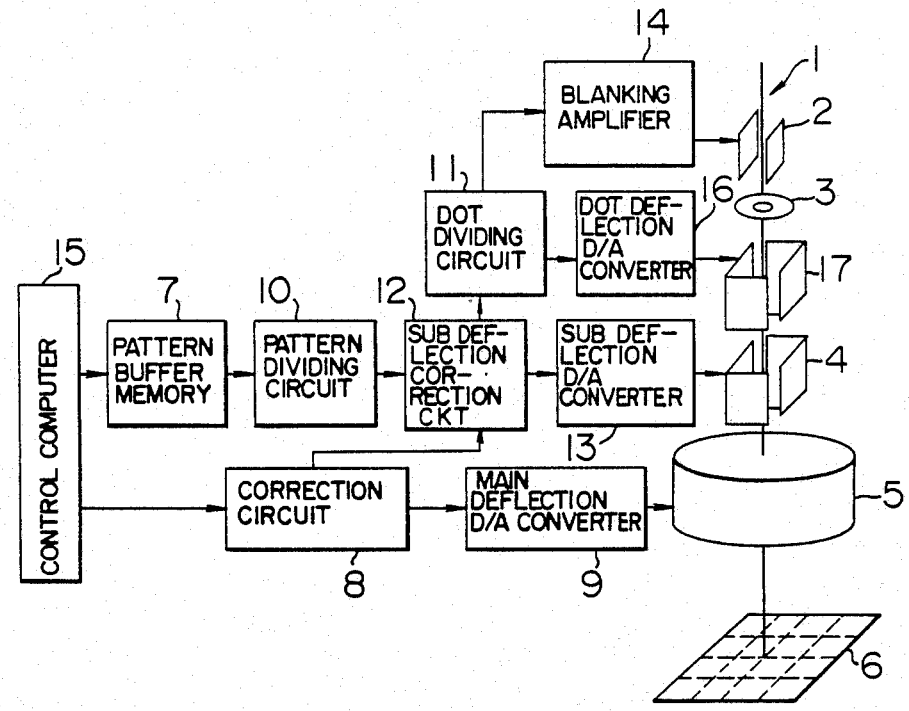
FIG. 4 is a fundamental arrangement diagram of another embodiment according to the invention.

In such a case, another embodiment of the invention shown in FIG. 4 is useful. In the foregoing embodiment, the deflection in the sub-field 22 and the dot exposure in the dot field 24 are performed by the subdeflector 4. However, in this embodiment, the sub-deflection D/A converter 13 of the intermediate number of bits between the main deflection D/A converter 9 and a dot deflection D/A converter 16 is newly provided, thereby separating the sub-deflection deflector 4 from a dot deflector 17. Although the number of operation times of the main deflector 5 is equal to the number of dot fields 24 in the previous embodiment, in this embodiment, this number can be reduced to the number of sub-fields 22 which is sufficiently smaller than the number of dot fields 24 owing to the above-mentioned separated arrangement. Thus, the total settling time of the main deflection D/A converter 9 can be remarkably reduced.

In this embodiment, the respective numbers of bits of the main deflection D/A converter 9, sub-deflection D/A converter 13 and dot deflection D/A converter 16 are, for example, 18 bits, 12 bits and 8 bits. Now assuming that one LSB is 0.01 $\mu$m, the deflection regions of the main deflector 5, sub deflector 4 and dot deflector 17 are 2.5 mm square, 40 $\mu$m square and 2.5 $\mu$m square, respectively. Since the number of sub-fields 22 is so small i.e. $(2^{18}/2^{12})^2 \simeq 4 \times 10^3$, the total settling time of the D/A converter 9 becomes so short i.e. $4 \times 10^3 \times 10$ $\mu$sec = 40 msec.

On one hand, in this embodiment, although the deflection between the dot fields 24 in the sub-field 22 is performed by the sub deflector 4, this settling time can be reduced to a value which can be ignored as compared with the settling time of the D/A converter 9.

It is obviously preferable to use the electrostatic deflectors having a high response speed as the subdeflector 4 and dot deflector 17.

One method of dividing a pattern into small regions will now be explained.

Figure 5A:
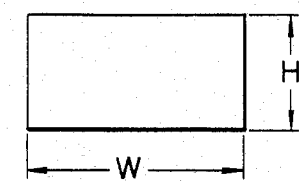
FIGS. 5A to 5C and FIGS. 6A and 6B are diagrammatical views for explaining a method for dividing a pattern according to the invention.
Figure 5B:
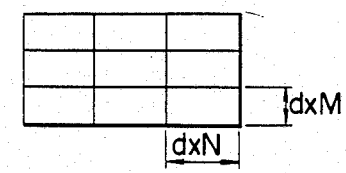
Figure 5C:
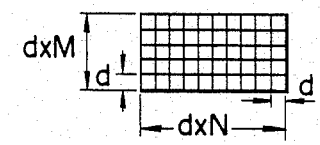

FIGS. 5A to 5C show one example of division of a pattern to perform the dot exposure in the invention. FIG. 5A shows a pattern to be exposed (width is W and height is H) and FIG. 5B shows the pattern after division, in which this diagram illustrates the state in that the pattern is divided into N equal parts in the direction of width and into M equal parts in the direction of height when the dimension d of the electron beam is used as a unit. A single divided pattern is shown in detail in FIG. 5C. N and M are arbitrary integers below 50.

Figure 6A:
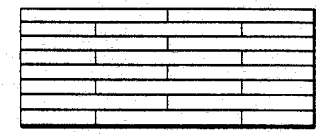
Figure 6B:
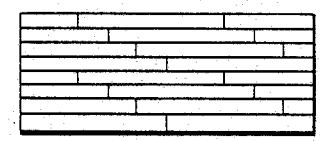

In the actual pattern, a higher accuracy is usually required for a shorter dimension. In addition, since the control of a one-dimensional pattern is simpler than that of a two-dimensional pattern in the high speed process as well, M is desirably set to 1 in consideration of a circuit arrangement. On the contrary, when N is a large value (i.e., an allowable error is large), there is a risk such that a connection failure between the divided small patterns occurs. However, this problem can be avoided by alternately shifting the dividing positions as shown in FIGS. 6A and 6B.

A method of reducing the dot exposure time in the dot field will now be described.

All of the patterns to be exposed such as an Large Scale Integrated Circuit (LSI) pattern or the like do not always require a fine and high accuracy but in many cases, a moderate accuracy is enough for most of the patterns. Therefore, if the beam current is switched in accordance with the pattern and the pattern which needs a fine and high accuracy is exposed at a small pitch by means of a small spot beam and the other patterns are exposed at a large pitch by means of a large beam, the overall pattern writing time can be extremely reduced.

Figure 7A:
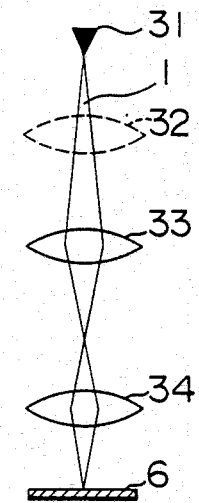
Figure 7B:
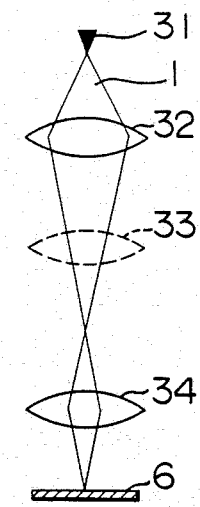

FIGS. 7A and 7B shows one example whereby the current value of the spot beam 1 is switched. A reference numeral 31 denotes an electron source. For the purpose of writing a super fine pattern, it is desirable to use a field electron emitter having a small source diameter and high brightness. Numerals 32, 33 and 34 are electron lenses and 6 is a substrate on which a pattern is exposed. FIG. 7A shows the state in that the spot beam 1 is small and only the electron lenses 33 and 34 are used and the diameter of the spot beam 1 is demagnified and is projected onto the substrate 6. FIG. 7B shows the state in that the diameter of the spot beam 1 is magnified and the electron lenses 32 and 34 are used, thereby constituting the magnification system. In both cases, by setting the electron lenses 32 and 33 such that the object positions of the electron lens 34 become the same, the use conditions of the electron lens 34 can be made identical. Namely, the diameter of the spot beam 1 can be changed by merely selecting which one of the electron lenses 32 and 33 is used. In this case, the beam current varies in proportional to the square of the magnification. Therefore, if the magnification ratio is set to 1:2, the beam current changes at a ratio of 1:4.

FIGS. 8A and 8B show another embodiment by which the beam current is changed. In this embodiment, as shown in FIGS. 8A and 8B, the beam current is varied by exchanging apertures 36 and 36' to restrict the beam semiangle of the spot beam 1 arranged in the final objective lens 34. The change in beam current in this case is proportional to the square of the ratio between the diameters of the apertures 36 and 36'.

In this case, the conditions of the electron lenses 33 and 34 before and after the exchange of the apertures 36 and 36' may be all identical.

In the case of increasing the electron beam current, it is necessary to increase the scanning speed when it is assumed that the pitches of the deflection scanning for writing a pattern are the same. However, in the case of using the field electron emitter as an electron source, the speed is required to be very large due to the large current density, and consequently a problem is caused in the time response of a beam deflection electronics. Therefore, it is desirable to constitute such that the scanning speeds are made equal by making the scanning pitch rough.

In a high accurate pattern writing apparatus, the digital deflection is performed. Therefore, if the scanning pitch is selected so as to become a ratio of integer times the minimum deflection unit (LSB) and the beam current ratio is set to be the square of the scanning pitch, the scanning speeds can be made equal. FIGS. 9A and 9B shows an example of patterns written by such a method as mentioned above. FIG. 9A shows a pattern written at a fine scanning pitch by means of a small beam. FIG. 9B shows a pattern written at a rough scanning pitch by means of a large beam. As will be understood from the diagrams, in the case of writing a pattern by a large beam, the number of beam radiation times is small (reciprocal of the beam current ratio) and the scanning speeds are the same; consequently, the pattern writing time is reduced.

As described above, an example of switching of two steps has been shown. However, the number of electron lenses may be easily set to three or more depending on the required accuracy of a pattern. The appropriate excitations of the both electron lenses 32 and 33 make it possible to realize an arbitrary magnification between the magnifications which are derived by only the lens 32 and by only the lens 33.

As described above, according to this embodiment, a pattern of a moderate precision can be written at a high speed, and as a result the whole pattern writing time can be extremely reduced. For example, in the case of writing a pattern at two steps in which a pattern writing area ratio of the high accurate pattern is 20% and a beam current ratio is 1:4, the pattern can be written for the time of 40% as compared with the conventional method by which a whole pattern is written by a small beam.

As described above, according to the present invention, the settling time of the D/A converter in association with the digital scanning can be reduced, so that it is possible to avoid that the exposed time becomes the circuit determining rate. Therefore, it is possible to constitute a high speed and high accurate electron beam lithography apparatus which can make the most of the high current density of the electron beam.

We claim:

1. An electron beam lithography apparatus comprising:
    means for generating a spot beam;
    means for exposing a desired pattern onto a wafer using said spot beam to form said pattern as dots on said wafer;
    means for dividing said pattern into small regions;
    main deflecting means for deflecting said spot beam to one of a plurality of sub-fields dividing a field to be exposed on said wafer;
    sub-deflecting means for deflecting said spot beam and for designating an origin of said small region in said sub-field; and
    dot deflecting means for digitally scanning and for fully exposing the portion inside said small region by a fixed correction amount by use of said spot beam.

2. An apparatus according to claim 1, wherein said dot deflecting means enables continuous operation of said spot beam in association with the deflection within its deflecting range.

3. An apparatus according to claim 1, wherein said sub deflecting means and said dot deflecting means comprise electrostatic deflectors.

4. An apparatus according to claim 1, wherein said pattern dividing means divides said pattern into regions of the number as many as integer times a unit which is equal to a dimension of said spot beam.

5. An apparatus according to claim 1, further comprising means for switching a diameter of said spot beam to a plurality of values and means for switching a distance between a point presently being irradiated by said spot beam to a next point to irradiated by said spot beam for said scanning so as to be substantially proportional to a ratio between the diameters of said spot beam in accordance with said switching.

6. An apparatus according to claim 1, further comprising means for switching a current value of said spot beam into a plurality of values and means for switching a distance between a point presently being irradiated by said spot beam to a next point to be irradiated by said spot beam for said scanning so as to be substantially proportional to a ratio of the root of the current value of said spot beam in accordance with said switching.

7. An apparatus according to claim 1, wherein said spot beam generating means comprises a field electron emitter.

* * * * *